(12) United States Patent
    Chimakurthy

(10) Patent No.: US 9,816,375 B2
(45) Date of Patent: Nov. 14, 2017

(54) SYSTEM AND METHODS FOR DAMPING A RESONANT ANTENNA IN AN NMR DOWNHOLE TOOL

(71) Applicant: Halliburton Energy Services, Inc., Houston, TX (US)

(72) Inventor: Lakshmi Sri Jyothi Chimakurthy, Houston, TX (US)

(73) Assignee: HALLIBURTON ENERGY SERVICES, INC., Houston, TX (US)

( * ) Notice: Subject to any disclaimer, the term of this patent is extended or adjusted under 35 U.S.C. 154(b) by 0 days.

(21) Appl. No.: 15/100,845

(22) PCT Filed: Aug. 13, 2015

(86) PCT No.: PCT/US2015/045107
§ 371 (c)(1),
(2) Date: Jun. 1, 2016

(87) PCT Pub. No.: WO2017/027044
PCT Pub. Date: Feb. 16, 2017

(65) Prior Publication Data
US 2017/0198571 A1    Jul. 13, 2017

(51) Int. Cl.
*G01V 3/00* (2006.01)
*E21B 49/00* (2006.01)
(Continued)

(52) U.S. Cl.
CPC .......... *E21B 49/00* (2013.01); *E21B 47/122* (2013.01); *G01V 3/30* (2013.01); *G01V 3/32* (2013.01);
(Continued)

(58) Field of Classification Search
CPC ......... E21B 49/00; E21B 47/122; G01V 3/30; H03F 2200/294; H03F 2200/451; H03K 17/687
(Continued)

(56) References Cited

U.S. PATENT DOCUMENTS 4,646,021 A * 2/1987 Brown ................ G01V 3/32
                                                324/303
4,933,638 A * 6/1990 Kleinberg ............ G01N 24/081
                                                324/303
(Continued)

FOREIGN PATENT DOCUMENTS

WO          9914615 A1    3/1999
WO       2014081524 A1    5/2014

OTHER PUBLICATIONS

ISR/WO for PCT/US2015/045107 dated Apr. 29, 2016.

*Primary Examiner* — Ojiako Nwugo
(74) *Attorney, Agent, or Firm* — McDermott Will & Emery LLP

(57) ABSTRACT

Circuits including a low noise amplifier (LNA) configured to receive a radio-frequency (RF) that include an input transistor to receive a waveform control signal at a gate terminal are provided. The circuits include a control transistor configured to receive a gate signal from a source terminal in the input transistor when the waveform control signal is high and to discharge the gate signal into a current sink coupled to ground when the waveform control signal is low at a controlled rate based on a resistor-capacitor (RC) network and a changing gain of the control transistor. The circuits include a buffer and a dump transistor to connect the critical resistor for optimal damping to the input of LNA when the dump transistor is 'on' and disconnect when the dump
(Continued)

transistor if off. Systems and methods for use in an NMR sensor including a circuit as above are also provided.

25 Claims, 8 Drawing Sheets

(51) Int. Cl.
- *E21B 47/12* (2012.01)
- *G01V 3/32* (2006.01)
- *G01V 3/30* (2006.01)
- *H03F 3/19* (2006.01)
- *H03K 17/687* (2006.01)

(52) U.S. Cl.
CPC .......... *H03F 3/19* (2013.01); *H03F 2200/294* (2013.01); *H03F 2200/451* (2013.01); *H03K 17/687* (2013.01)

(58) Field of Classification Search
USPC ............................... 340/854.6; 324/303, 311
See application file for complete search history.

(56) References Cited

U.S. PATENT DOCUMENTS

| | | | | |
|---|---|---|---|---|
| 5,051,700 | A * | 9/1991 | Fox | H04B 1/163 324/322 |
| 5,298,869 | A * | 3/1994 | Jinich | H03F 1/301 323/280 |
| 6,388,441 | B1 | 5/2002 | Chen | |
| 6,897,729 | B1 | 5/2005 | Jin et al. | |
| 6,956,370 | B2 | 10/2005 | Heidler | |
| 7,109,714 | B2 | 9/2006 | Rudakov et al. | |
| 7,940,076 | B2 | 5/2011 | Chimakurthy et al. | |
| 8,396,164 | B2 | 3/2013 | Suzuki et al. | |
| 8,681,512 | B2 | 3/2014 | Westmoreland et al. | |
| 2005/0127909 | A1 | 6/2005 | Kruspe et al. | |
| 2005/0208921 | A1* | 9/2005 | Roufoogaran | H03F 3/193 455/311 |
| 2007/0176686 | A1* | 8/2007 | Fu | H03F 1/342 330/294 |
| 2010/0060363 | A1* | 3/2010 | Han | H03F 1/26 330/306 |
| 2010/0308914 | A1* | 12/2010 | Kuo | H03F 3/45179 330/261 |
| 2011/0036569 | A1 | 2/2011 | Bass et al. | |
| 2013/0265055 | A1 | 10/2013 | Mitchell et al. | |

* cited by examiner

SYSTEM AND METHODS FOR DAMPING A RESONANT ANTENNA IN AN NMR DOWNHOLE TOOL

BACKGROUND

Current technologies for nuclear magnetic resonance (NMR) sensors use the same antenna to generate high-energy radio-frequency (RF) excitation pulses and to receive and detect the echo signals induced by the high-energy RF excitation pulses. Thus, NMR sensors face the problem of decoupling a receiver circuit driving a low noise amplifier (LNA) receiving the echo signal provided by the antenna from undesirable ringing effects produced by transient high voltage in the antenna after excitation pulse transmission. Current solutions rely on dampening resistor controlled by a switch to dampen a residual excess voltage in the antenna circuit from a few volts (Vs) to nano-volts (nVs). The resistor adds undesirable noise if left during reception, hence turned off during the reception. Fast turn off of switch like devices in general can induce undesirable ringing in the antenna due to charge injection effects. To quench the ringing effects induced in the antenna due to switching action current technologies introduce a resistor-capacitance (RC) delay circuit in the gate driver of the switching device. This slows down the turn off of the switch and hence induces less ringing in to the antenna. However, use of RC circuits alone to increase the turn-off time of the switching device tends to delay the ability of the NMR sensor to receive and process echo signals by at least a few hundreds of microseconds (µs).

In addition to the undesirable reduction in time resolution, these delays adversely limit data collection rate of the NMR sensor. These factors result in undesirably slow NMR receivers.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, without departing from the scope of this disclosure.

In the figures, elements having the same or similar reference numerals refer to the same or similar function, or step, unless otherwise noted.

DETAILED DESCRIPTION

Figure 1:
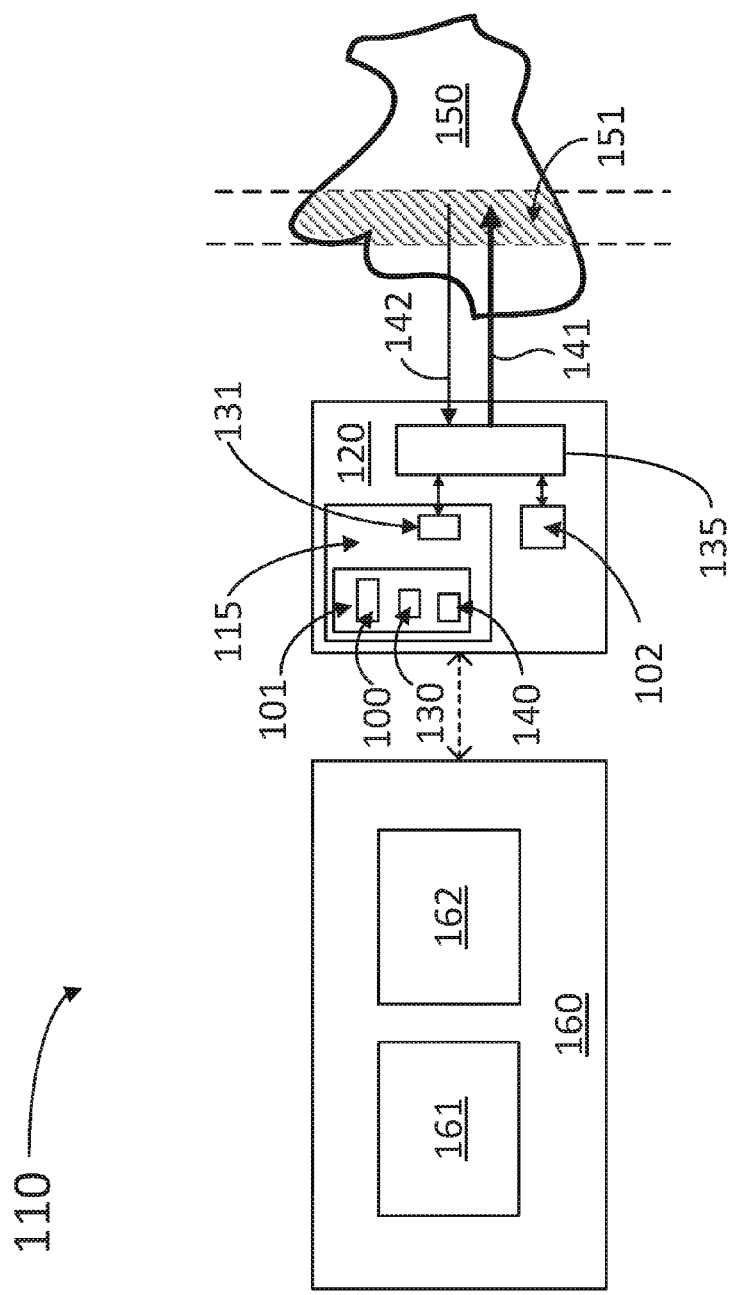
FIG. 1 illustrates a nuclear magnetic resonance (NMR) sensor for use in a downhole logging tool including an antenna and an ultrafast damping system having a receiver circuit.

The present disclosure relates to systems and methods for damping a resonant antenna in an NMR downhole tool. More specifically, the present disclosure provides circuits that enable ultrafast damping of antenna excess voltage after an RF excitation pulse so that a receiver circuit is ready to measure an echo signal quickly in an NMR downhole tool.

Embodiments disclosed herein provide fast damping of antenna excess voltage in an NMR sensor, thus enabling increased pulse and data collection rates. Moreover, a shortened response time of the NMR sensor increases the time resolution of the NMR sensor, which is desirable for NMR-based relaxation time measurements. Embodiments consistent with the present approach critically dampen an excess voltage from a few volts to a few hundred nano-volts (nV). In some embodiments, the LNA circuit completes the damping from a few hundred nV to a few nano-volts (nV).

In one or more embodiments, a circuit of the present disclosure includes a low noise amplifier (LNA) configured to receive a radio-frequency (RF) signal from an antenna and an input transistor configured to receive a waveform control signal at a gate terminal. The circuit may further include a control transistor configured to receive a gate signal from a source terminal in the input transistor when the waveform control signal is high and discharges the gate signal in to a current sink coupled to ground when the waveform control signal is low. A buffer may be configured to couple the control transistor to a dump transistor, the dump transistor being configured to switch the critical dampening resistor in parallel to the LNA between an 'on' state when the dump transistor is 'on', and an 'off' state when the dump transistor is 'off'.

In one or more embodiments, a system may include an antenna configured to transmit and receive RF signals and a power supply coupled with the antenna and configured to provide a high voltage pulse to the antenna to transmit an RF excitation pulse. The system may further include an interface circuit coupling the antenna to a receiver circuit, the interface circuit being configured to isolate the receiver when the antenna transmits the RF excitation pulse and couple to the receiver when the antenna receives an RF echo signal. In some embodiments, the receiver circuit may further include an input transistor configured to receive a waveform control signal at the gate terminal. Also, the receiver circuit may include a control transistor configured to receive a gate signal from a source terminal in the input transistor when the waveform control signal is high and discharge the gate signal in to a current sink coupled to ground when the waveform control signal is low. Accordingly, in some embodiments the system may include a buffer circuit coupling the control transistor to a dump transistor, the dump transistor configured to switch the critical dampening resistor in parallel to LNA between an 'on' state and an 'off' state.

In yet other embodiments, a method may include introducing a downhole tool, applying a radio-frequency (RF) pulse to an antenna in the downhole tool, providing a waveform control signal to the gate driver in the receiver circuit coupled to the antenna and damping any residual energy in the antenna after a transmit. Further, the method may include coupling a low noise amplifier in the receiver circuit to the antenna.

FIG. 1 illustrates a nuclear magnetic resonance (NMR) sensor 110 for use in a downhole logging tool. As illustrated, the NMR sensor 110 may include an antenna 135 coupled with an ultrafast damping system 120 having a receiver module 115. Receiver module 115 includes a receiver front end 101 and a Low-Noise Amplifier (LNA) 131. Receiver front end 101 may include a gate driver 100, a dump switch 130, and a critical resistor 140. The NMR sensor 110 may further include a controller 160 that includes a processor 161 and a memory 162. In some embodiments, memory 162 is configured to store commands which, when executed by processor 161 cause controller 160 to perform steps consistent with methods as disclosed herein. In some embodiments, controller 160 may be a computer or a microprocessor.

The antenna 135 may be coupled to a receiver module 115. In some embodiments, antenna 135 is a resonant antenna configured to transmit and receive radio-frequency (RF) signals. Antenna 135 receives power from a power supply 102 to transmit an RF excitation pulse 141. Excitation pulse 141 propagates through a substrate 150 surrounding NMR sensor 110. The substrate 150 may comprise, for example, a subterranean formation penetrated by a wellbore and the NMR sensor 110 may be lowered within the wellbore until locating the subterranean formation. A portion 151, or 'shell', of substrate 150 may send an echo signal 142 back to antenna 135 in response to excitation pulse 141. Echo signal 142 is much smaller in amplitude, compared to excitation pulse 141. Furthermore, certain characteristics of echo signal 142 may provide useful information of materials forming part of or otherwise within portion 151 of substrate 150, and their physical condition (e.g., viscosity, density, physical phase-liquid, gas, or solid-, and the like).

In some embodiments, antenna 135 receives echo signal pulse 142 after a selected period of time from transmitting excitation pulse 141. When antenna 135 is set in a receive mode, LNA 131 is configured to receive and amplify echo signal 142 from antenna 135. LNA 131 relays the amplified signal to controller 160 for processing. Controller 160 may use processor 161 to determine a characteristic of the substrate based on the received RF signal in the echo signal 142. In some embodiments, the role of receiver front end 101 is to configure LNA 131 to receive and amplify echo signal 142. Critical resistor 140 in receiver front end 101 dampens a high-voltage (HV) ringing in antenna 135 after the transmission of excitation pulse 141. The gate driver 100 turns off the dump control switch 130 fast enough, but this may induce ringing effects in antenna 135 due to the turn off.

Figure 2:
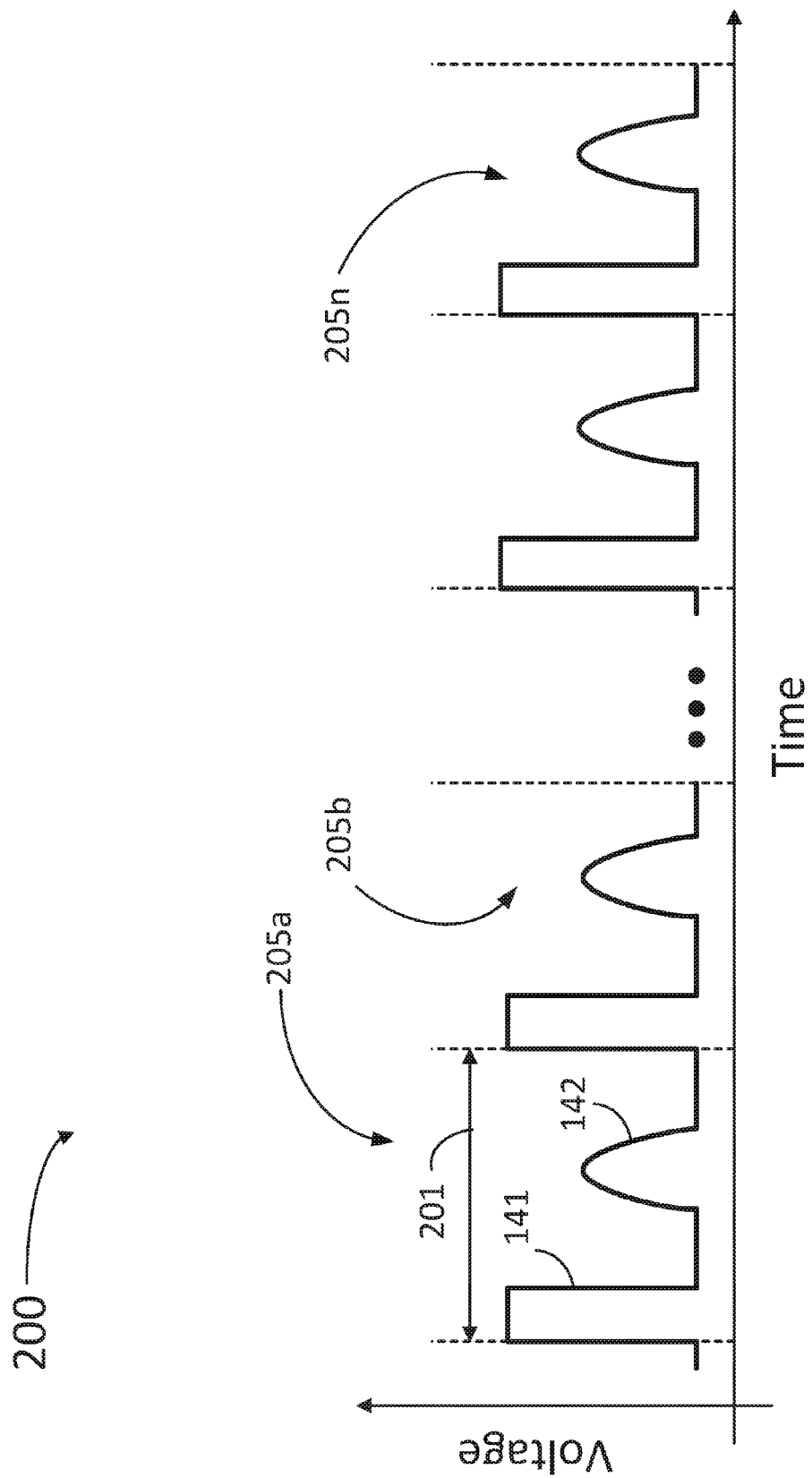
FIG. 2 illustrates a pulse sequence in an antenna of an NMR sensor including an excitation pulse and an echo signal.

FIG. 2 illustrates a pulse sequence 200 for antenna 135 in NMR sensor 110, including excitation pulse 141 and echo signal 142. The abscissa in FIG. 2 (X-axis) indicates time in arbitrary units, and the ordinate (Y-axis) indicates voltage, also in arbitrary units. A period of time 201 (Te) includes excitation pulse 141 and echo signal 142, and completes one of a plurality of measurement units 205a, 205b, ..., 205n (hereinafter referred to collectively as 'measurement units 205'), where the value of 'n' is an arbitrary integer number. In some embodiments, it is desirable that the value of Te 201 be as low as physically possible to have a large value of 'n' measurement units per unit of time. In some embodiments, it is desirable that Te 201 be at least lower than a few hundred μs, such as 600 μs, or less. In some embodiments, Te 201 may be between 200 to 250 μs, or even less.

Excitation pulse 141 may have an amplitude as high as 1800 V, which can result in a 100 V excess voltage at antenna 135 after transmission of RF excitation pulse 141 ceases. Echo signal 142 may have an amplitude substantially lower, about a few hundred nVs, such as 200 nV or less. It may be desirable that the excess voltage in antenna 135 be lower than the energy expected from echo signal pulse 142. Furthermore, in some embodiments it is desirable that the transition in the energy coupling of antenna 135 be accomplished within a short time interval, such as about 100 μs, or less.

Figure 3:
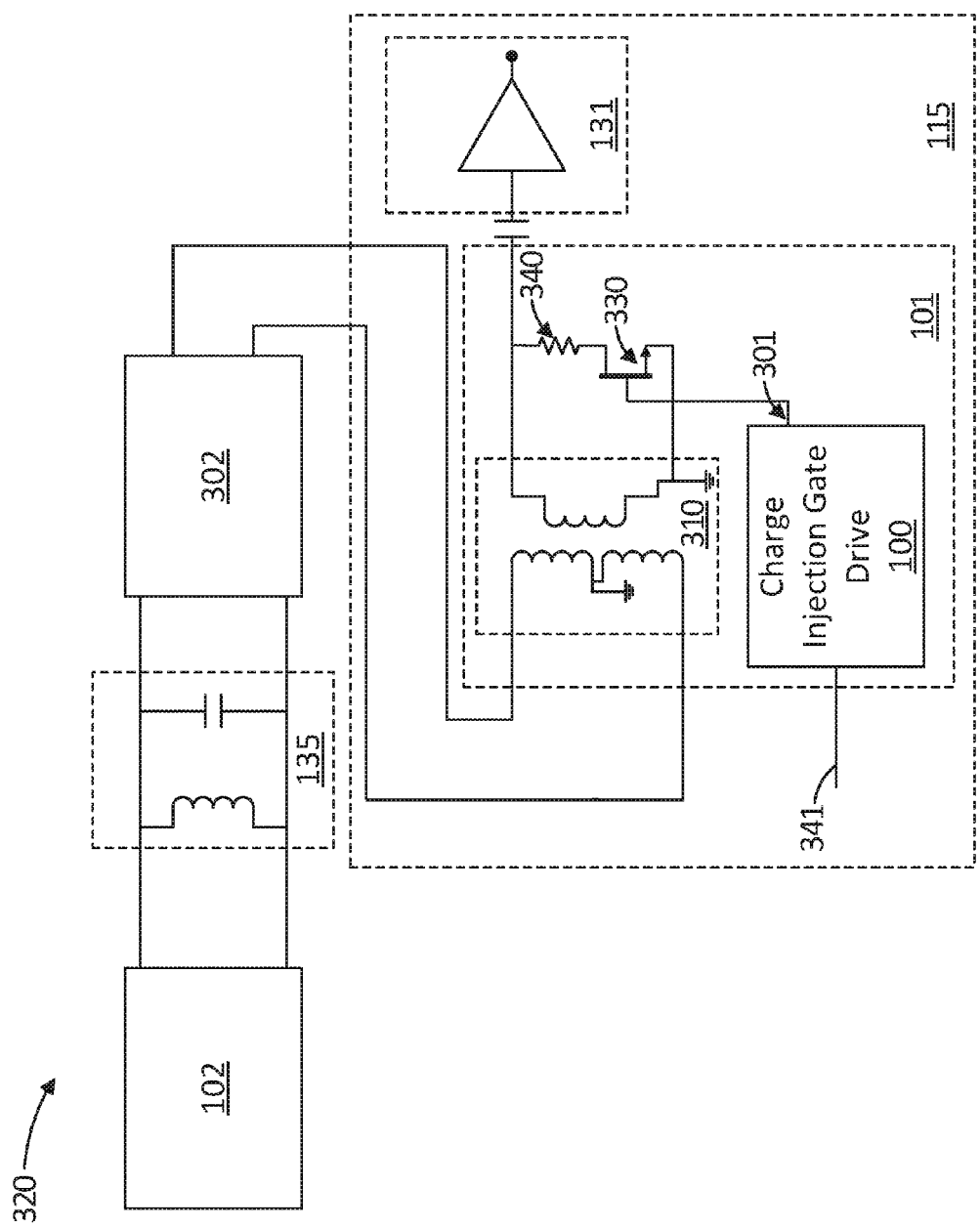
FIG. 3 illustrates a block diagram of an ultrafast damping system in an NMR sensor, including a resonant antenna and a receiver circuit having a low noise amplifier (LNA).

FIG. 3 illustrates a block diagram of an ultrafast damping system 320 in an NMR sensor, similar to the NMR sensor 110 of FIG. 1. As illustrated, the ultrafast damping system 320 may include an antenna 135 and a receiver front end 101 having LNA 131. Power supply 102 provides a high voltage pulse to antenna 135 to generate RF excitation pulse 141. A transformer 310 enhances the voltage level of RF echo signal 142 when antenna 135 is coupled to LNA 131, it serves for impedance/noise matching, helps in isolation and common mode rejection. System 320 may further include an interface circuit 302 coupling antenna 135 to receiver module 115. In some embodiments, interface circuit 302 protects receiver module 115 from the high voltages generated when antenna 135 transmits RF excitation pulse 141 and also may help dampening part of the HV after transmission to a voltage level safe for the receiver to handle.

A critical resistor 340 is placed at the input of LNA 131 to damp the excess voltage in antenna 135 after the transmission of excitation. Dump transistor 330 may be configured to connect the critical resistor in parallel to the LNA during transmission and right after transmission when it is needed to dampen the excess energy in the antenna. This switch transistor 330 is then turned off by Gate driver circuit 100 when Gate driver circuit 100 receives an input signal 341. Gate driver circuit 100 provides gate signal 301 from a waveform control signal 341 as input. A digital board (not shown in FIG. 3) may provide waveform control signal, which is level shifted to signal 341 to gate driver 100. In that regard, control signal 341 may include a level shifted version of square pulse transitioning between 0 V and 3.3 V, or between 0 V and 5 V, whose absolute value may transition between 0-10V, the square pulse having a duration of approximately the transmit phase in receiver front end 101. In some embodiments, gate driver 100 is configured to generate gate signal 301 such that the voltage rate of change with time dV/dt substantially reduces charge injection effects that cause ringing effects in the antenna 135 which may range in millivolts to volts.

Ultrafast damping system 320 may exhibit a temporal response including three phases, namely: a transmit phase for transmitting RF excitation pulse 141, a damp phase to damp excess voltage in antenna 135, and a receive phase to detect RF echo signal with LNA 131. Receiver front end 101 may be configured to reduce the duration of the damp phase as much as possible without inducing charge injection and ringing effects in antenna 135. Embodiments of ultrafast damping system 320 as disclosed herein achieve short Te 201 (FIG. 2) periods, thus enabling high pulse repetition rates for NMR sensing.

In some embodiments, receiver module 115 receives and amplifies signals as soon as excitation pulse 141 is completed. This may be challenging because a large amount of excess voltage has to be coupled out of antenna 135 after a transmit phase. A dump transistor 330 selectively couples a critical resistance 340 to the input of LNA 131 and at least partially suppresses a high voltage ringing. In some embodiments, it is desirable that critical resistor 340 be present during the damp phase and not during the receive phase. In fact, critical resistance 340 adds Johnson noise to the input of LNA 131, and thus it is disengaged at the low voltage levels expected in antenna 135 during the receive phase. Although critical resistor 340 can damp high voltage ringing across antenna 135 during the damp phase, antenna 135 will get re-excited at millivolt (mV) to volt levels due to charge injection effects if dump transistor 330 is abruptly turned 'off'. Accordingly, when a voltage across resistor 340 is a few hundred nV or less, gate circuit 100 may be configured to open dump transistor 330 smoothly and slowly so that LNA 131 enters the receive phase. In the receive phase, critical resistor 340 is disengaged from LNA 131.

In some embodiments, receiver front end 101 critically damps ringing induced in antenna 135 having amplitudes ranging from a few volts down to a few hundreds of nVs. Under these conditions, dump transistor 330 is configured to dump excess voltage from antenna 135 to the ground at a first rate. The slope of the current-voltage (IV) curve of dump transistor 330 determines the first rate, during which dump transistor 330 operates in linear mode. In some embodiments, dump transistor 330 is 'on' (closed) during the damp phase and is 'off' (open) in the receive phase. In some embodiments, the turning 'off' of dump transistor 330 occurs relatively slowly, as compared with an initial stage in the damp phase. Accordingly, some embodiments adjust the rate of damping during the damp phase from a fast first stage to a slow second stage. The second stage may damp excess voltage in antenna 135 from a few μVs to a few nVs. Thus, receiver front end 101 may reduce voltage in antenna 135 to about a few hundred nV (100 nV up to 600 nV). When voltage in antenna 135 is low enough a second, slower damp stage may be engaged to avoid re-excitation and additional ringing of antenna 135. In some embodiments, gate drive circuit 100 includes an RC delay for the second, slower damp stage at the input of LNA 131. Accordingly, gate drive 100 provides a waveform control signal 301 to dump transistor 330. In some embodiments, waveform control signal 301 is a nonlinear gate signal that is faster in the linear region of dump transistor 330 while slower and smoother during the transition between active to cut-off region of dump transistor 330. Thus, in embodiments consistent with the present disclosure, gate drive circuit 100 largely reduces charge injection during the damp phase. In some embodiments an overall turn off time between the end of the transmit phase and the beginning of a receive phase is substantially less than a few tens of μs (e.g., 20 μs, 30 μs, or even less).

Figure 4:
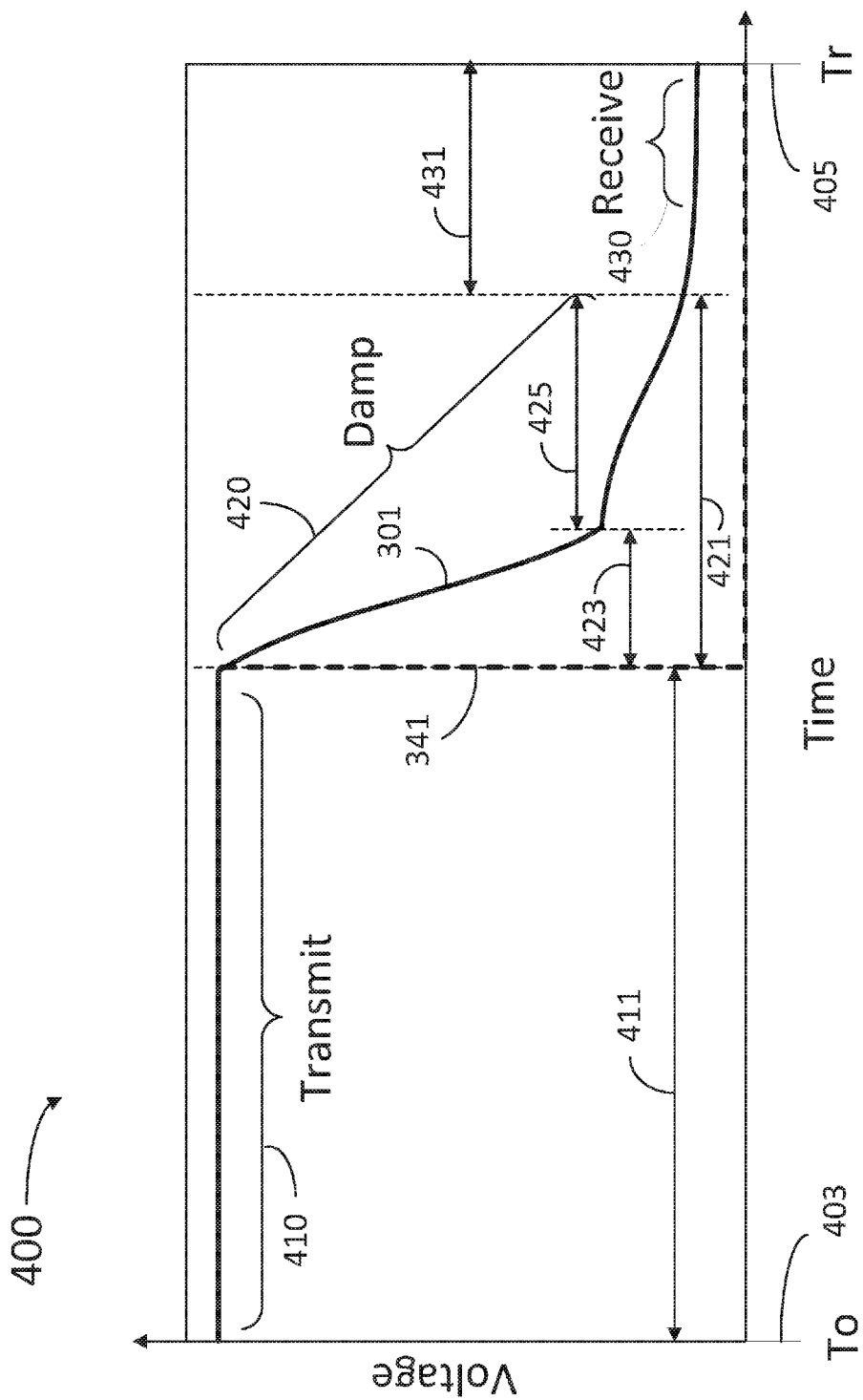
FIG. 4 illustrates a chart with a waveform control signal and a gate signal for a Dump transistor in the receiver circuit of an NMR sensor.

FIG. 4 illustrates a chart 400 with a waveform control signal 341 and a gate signal 301 for a receiver circuit of an NMR sensor. The abscissa in chart 400 (X-axis) indicates time in arbitrary units, and the ordinate (Y-axis) indicates voltage, also in arbitrary units. An initial time 403 (To) indicates the start of a transmission of RF excitation pulse 141, and a final time 405 (Tr) indicates a time when LNA 131 is configured to receive RF echo signal 142. In some embodiments Tr 405 may be about 100 μs, or even less (assuming To=0) and this helps in achieving a fast Te (201) of 200 μs or less. In some embodiments, waveform control signal 341 is the input to gate driver 100 (cf. FIG. 3). Accordingly, gate driver 100 produces gate signal 301, which may be fed to dump transistor 330. Gate signal 301 includes a transmit period 411 that corresponds to a transmit phase 410 of ultrafast damping system 320; a damp period 421 that corresponds to the damp phase 420 of ultrafast damping system 320; and a receive period 431 that corresponds to the receive phase 430 of ultrafast damping system 320.

As illustrated in FIG. 4, damp portion 420 includes two stages. A first stage 423 includes a faster decay of the excess voltage in receiver front end 101 relative to a second stage 425. First stage 423 is fast and smooth near the cutoff of dump transistor 330. In some aspects, first stage 423 includes the linear response region during which dump transistor 330 is still 'on' and excess charge is being dumped to ground through the source-drain channel of dump transistor 330. During first stage 423, the source-drain channel of dump transistor 330 includes sufficient resistance and has a limited coupling with the antenna. Thus, little antenna ringing may be expected during first stage 423. In some embodiments, first stage 423 covers an excess voltage damping from a few Vs (e.g., 10 V or maybe more) down to a few hundred nano-volts (e.g., 100 nV. Second stage 425 includes a region where dump transistor 330 transitions from active region to cutoff region for the gate-source voltage (Vgs). In second stage 425 gate driver 100 provides a smooth and slow reduction in gate voltage, thereby reducing charge injection, which may excite the antenna. This slow turn off can limit the charge injection induced ringing in the antenna to the order of nVs (i.e., 100 nVs), which will later be ringed down even more by the noise free input impedance of the LNA. Gate signal 301 includes receive phase 430, which starts when the excess voltage in antenna 135 is less than a few hundred nV (e.g., 100 nV or less) and dump transistor 330 is 'off'. Thus, during receive phase 430 critical resistor 340 is decoupled from the input to LNA 131 and antenna 135 is ready to pick up an echo signal from the substrate. In some embodiments, the combined length of first stage 423 and second stage 425 in damp portion 420 may be about 35 μs, or less. For example, in some embodiments LNA 131 is configured to receive RF echo signal 142 (at receive phase 430) within about 35 μs of the end of the RF excitation pulse transmission by the antenna (at the transmit phase 410).

Figure 5:
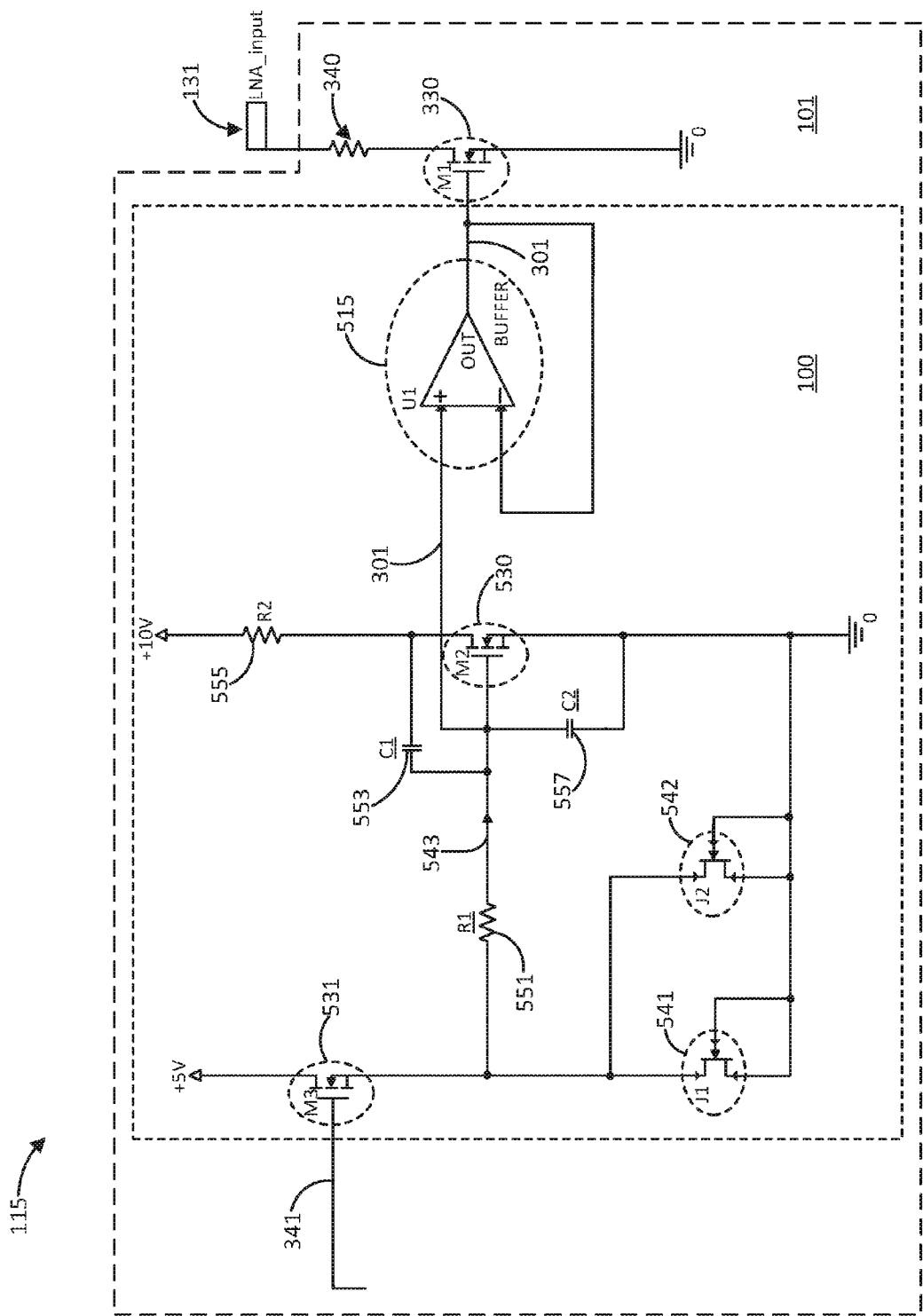
FIG. 5 illustrates a block diagram of a gate driver in a receiver circuit of an NMR sensor.

FIG. 5 is a circuit diagram of gate driver 100 and receiver front end 101 in receiver circuit 115 of an NMR sensor as disclosed herein. Low noise amplifier (LNA) 131 is configured to receive a radio-frequency (RF) signal from antenna 135. An input transistor 531 (e.g., a MOSFET transistor) receives waveform control signal 341. When control signal 341 is 'high' transistor 531 is turned 'on' completely and it will charge gate signal 543 to a voltage equal to the supply voltage of transistor 531 (e.g., +5V in this example) excluding input-resistance (IR) drops. The gate signal 543 looks approximately close to gate signal 301 (cf. FIG. 4). Control signal 341 is 'high' usually in the transmit phase, so gate signal 543 is charged to ~5V as indicated during transmit phase 410 (cf. FIG. 4). After the transmit phase is complete, control signal 341 goes low and turns off input transistor 531. Gate voltage 543 discharges itself slowly to ground based on: resistor-capacitor (RC) time constants set up by R1 551, C1 553, C2 557, the gate to drain capacitance (Cgd) of a control transistor 530, the gain of control transistor 530, a load resistor value (R2) 555, and current sinks 541 and 542. The gain of control transistor 530 is configured by its supply voltage (e.g., +10V). As gate control signal 543 transitions from +5V to 0V, control transistor 530 transitions from linear to active to cutoff region. The gain and the Cgd of control transistor 530 are different in each of transmit phase 410, damp phase 420, and receive phase 430 (cf. FIG. 4). As the discharge rate depends on the above mentioned list of parameters which vary according to the operating conditions of control transistor 530 and input transistor 531, the rate of discharge is also different in each of the three phases 410, 420, and 430. The discharge waveform on gate signal 543 looks as shown in FIG. 4 in damp phase 420 and receive phase 430 (cf. FIG. 4). In some embodiments, the circuit and circuit component parameters are chosen such that the damp period is about 40-50 µs or less. This waveform can be used to drive the gate of dump transistor 330.

Any one of transistors 531, 530, and 330 may be, without limitation, a field-effect transistors (FET), or a metal-oxide-semiconductor FET (MOSFET), according to different performance desired for gate driver 100.

In some embodiments, gate driver 100 includes a buffer circuit 515 buffering the gate of control transistor 530 to the gate of dump transistor 330. Dump transistor 330, critical resistor 340, and LNA 131 may be as described in detail above (cf. FIG. 3).

In some embodiments, a current sink 541 includes a transistor J1, and current sink 542 includes a transistor J2. Transistors J1 and J2 may be biased with a gate-source voltage (Vgs) equal to zero (0), or approximately equal to zero. Thus, current sinks 541 and 542 discharge the gate voltage of control transistor 530 when waveform control signal turns input transistor 531 'off'.

Control signal 341 is such that input transistor 531 is 'on' (closed) during the transmit phase of receiver front end 101. Further according to some embodiments input transistor 531 is 'off' (open) during the Damp and receive phase of receiver front end 101.

In some embodiments, dump transistor 330 and control transistor 530 are matched field-effect transistors (FETs). For example, in some embodiments dump transistor 330 and control transistor 530 are FETs selected from the same die in the same fabrication batch so that their behavior tracks one another over temperature and operation conditions of gate driver 100. In some embodiments, dump transistor 330 and control transistor 530 may be packaged as single component. More specifically, some embodiments include a dump transistor 330 having as low a gate-drain capacitance ($C_{gd}$) as possible. A low $C_{gd}$ mitigates SNR deterioration and reduces charge injection effects after the transmit phase (cf. FIG. 4). A higher Cgd may couple noise from buffer 515 stage of gate driver 100 to LNA 131 and result in SNR deterioration.

Buffer 515 provides the gate signal of control transistor 530 to the gate terminal of dump transistor 330. Buffer 515 may be configured to have a gate voltage in dump transistor 330 to follow a gate voltage in control transistor 530. The buffer stage 515 should have very low output impedance. Hence, dump transistor 330 induces minimal charge injection and ringing to antenna 135 while transitioning from 'active' to cutoff (e.g., damp period 420, cf. FIG. 4). In some embodiments, the low impedance of buffer 515 isolates the gate of dump transistor 330 from the input to LNA 131. This may be especially desirable when the input to LNA 131 is a few volts, or higher (e.g., tens of volts), which can be the case during a transient after transmit period 410. Buffer 515 has a low output impedance so excess energy that may accumulate in LNA 131 after transmit period 410, decouples from the gate of dump transistor 330.

In some embodiments, low Noise Factor (NF) is a desirable specification for LNA 131. To design low Noise Factor LNAs, it is desirable to use LNAs having relatively higher input impedance, as this simplifies the circuitry to achieve a target NF. A reduced charge injection as provided by gate driver 100 in receiver module 101 allows the use of LNA 131 having relatively higher input impedance, compared otherwise required when charge injection is not reduced. Thus, embodiments consistent with the present disclosure may be able to use a relatively high input impedance LNA 131 having a satisfactory NF. Accordingly, embodiments as disclosed herein relax the design considerations (i.e., reduce cost and complexity) of LNA 131. In such embodiments, receiver circuit 101 allows for a low Noise Factor LNA 131 to be used in conjunction with receiver front end 100 to achieve a reasonably low Te.

Figure 6A:
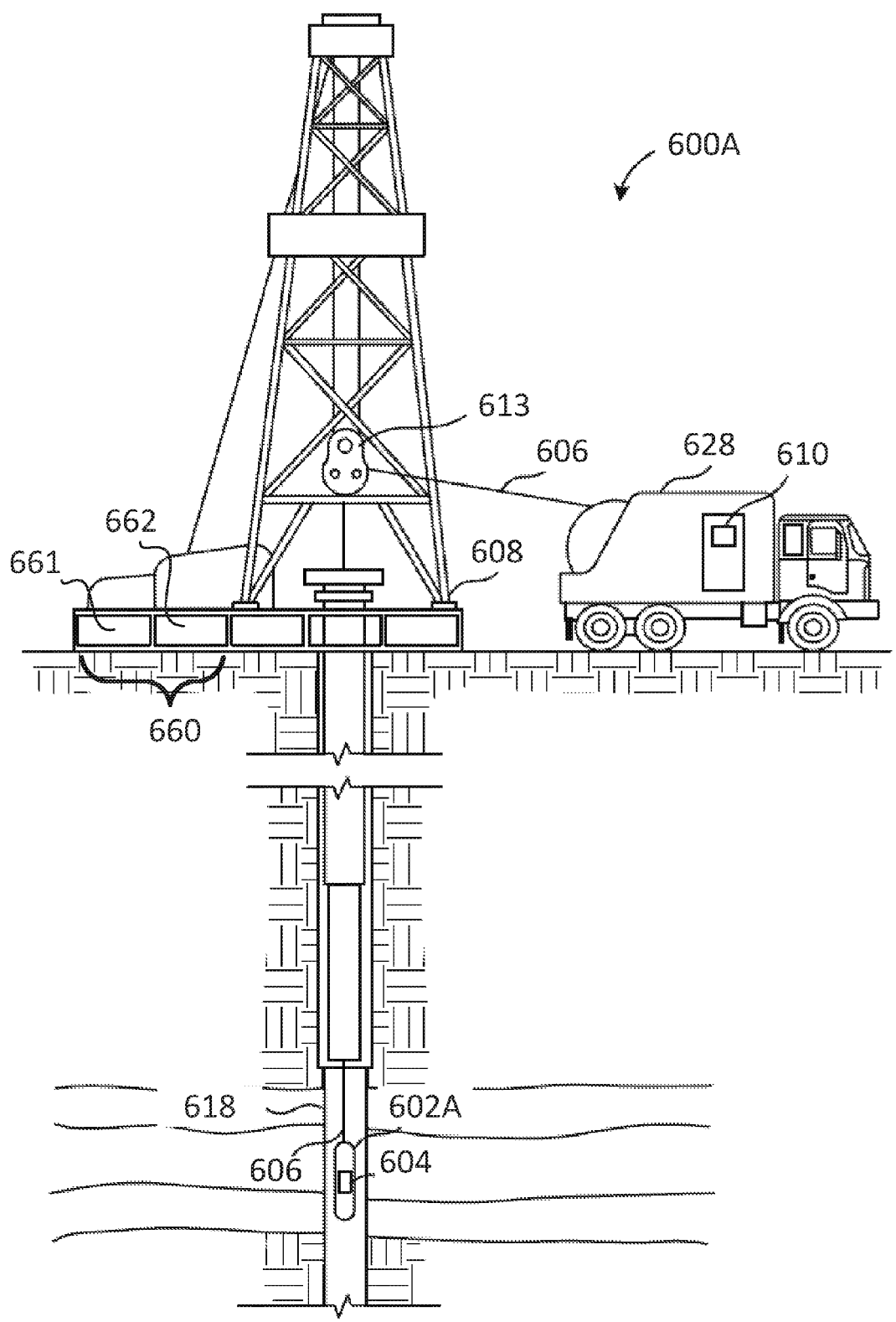
FIG. 6A illustrates a wireline system configured to use an NMR sensor during formation testing and sampling.

FIG. 6A illustrates an exemplary wireline system 600A configured to use an NMR sensor during formation testing and sampling. After drilling of a wellbore 618 is complete, it may be desirable to know more details of types of formation fluids and the associated characteristics through sampling with use of wireline formation tester.

System 600A may include a wireline tool 602A that forms part of a wireline logging operation that can include one or more NMR sensors 604, similar to the NMR sensor of FIG. 1, as part of a downhole measurement tool. System 600A may include a derrick 608 that supports a traveling block 613, and the wireline tool 602A, such as a probe or a sonde, may be lowered by wireline or logging cable 606 into a borehole 618. The downhole tool 602 may be lowered to the bottom of the region of interest and subsequently pulled upward at a substantially constant speed. The wireline tool 602A may be configured to measure fluid properties of the wellbore fluids, and any measurement data generated by wireline tool 602A and the one or more NMR sensors 604 can be communicated to a surface logging facility 628 for storage, processing, and/or analysis. In some embodiments, the wireline tool 602A is configured to measure properties of a substrate surrounding borehole 618, as disclosed herein. Logging facility 628 may be provided with electronic equipment 610, including processors for various types of signal processing. System 600A may further include a controller 660 having a processor 661 and a memory 662. Controller 660, processor 661, and memory 662 may be similar to controller 160, processor 161, and memory 162, described in detail above (cf. FIG. 1). Accordingly, memory 662 is configured to store commands which, when executed by processor 661 cause controller 660 to perform steps consistent with methods as disclosed herein.

Figure 6B:
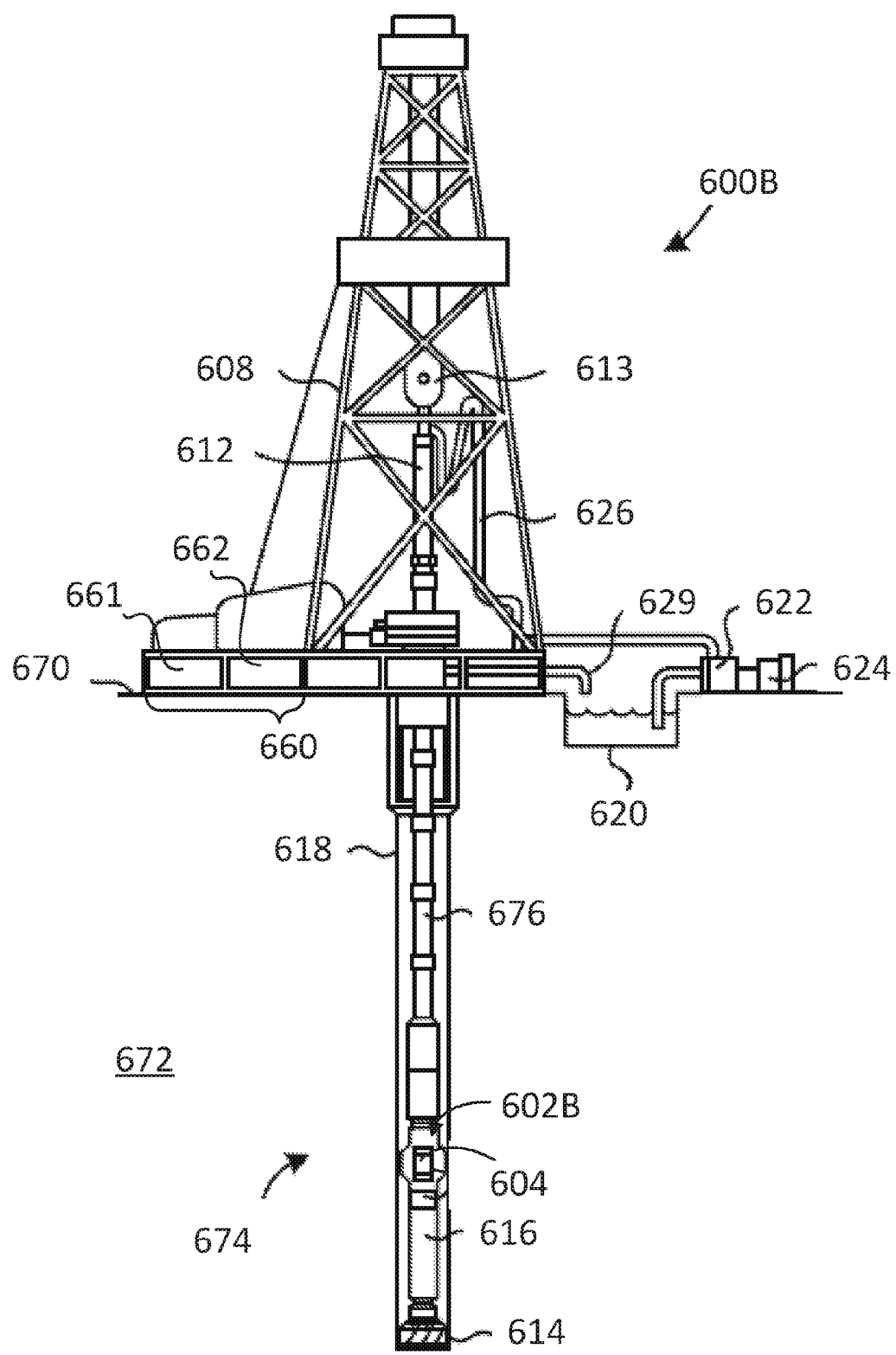
FIG. 6B illustrates a logging while drilling (LWD) system configured to use an NMR sensor during formation drilling.

FIG. 6B illustrates a logging while drilling (LWD) system 600B configured to use an NMR sensor during formation drilling. Borehole 618 may be created by drilling into the earth 672 using drilling tool 614. LWD system 600B may be configured to drive bottom hole assembly (BHA) 674 positioned or otherwise arranged at the bottom of a drill string 676 extended into the earth 672 from derrick 608 arranged at the surface 670. Derrick 608 includes a kelly 612 and a traveling block 613 used to lower and raise the kelly 612 and drill string 676 (FIG. 6A).

BHA 674 may include a drill tool 614 operatively coupled to a tool string 616 which may be moved axially within wellbore 618 as attached to the tool string 616. During operation, drill tool 614 penetrates the earth 672 and thereby creates wellbore 618. BHA 674 provides directional control of drill tool 614 as it advances into earth 672. Tool string 616 can be semi-permanently mounted with various measurement tools (not shown) such as, but not limited to, measurement-while-drilling (MWD) and logging-while-drilling (LWD) tools, that may be configured to take downhole measurements of drilling conditions. In other embodiments, the measurement tools may be self-contained within drill string 676, as shown in FIG. 6B.

Fluid or "drilling mud" from a mud tank 620 may be pumped downhole using a mud pump 622 powered by an adjacent power source, such as a prime mover or motor 624. The drilling mud may be pumped from mud tank 620, through a stand pipe 626, which feeds the drilling mud into drill string 676 and conveys the same to drill tool 614. The drilling mud exits one or more nozzles arranged in drill tool 614 and in the process cools drill tool 614. After exiting drill tool 614, the mud circulates back to the surface 670 via the annulus defined between the wellbore 618 and the drill string 676, and in the process, returns drill cuttings and debris to the surface. The cuttings and mud mixture are passed through a flow line 629 and are processed such that a cleaned mud is returned down hole through the stand pipe 626 once again.

BHA 674 may further include an LWD tool 602B. LWD tool 602B may include a sensor that incorporates the use of NMR sensor 604 (FIG. 6A). LWD tool 602B may be positioned between drill string 676 and drill tool 614.

A controller 660 including a processor 661 and a memory 662 is communicatively coupled to NMR sensor 604 in LWD tool 602B. While NMR device 100 may be placed at the bottom of wellbore 618, and extend for a few inches, a communication channel may be established by using electrical signals or mud pulse telemetry for most of the length of tool string 676 from drill tool 614 to controller 660. Memory 662 includes commands which, when executed by processor 661 cause controller 660 to perform steps in methods consistent with the present disclosure. More specifically, controller 660 may provide commands to and receive data from NMR sensor 604 during operation. For example, in some embodiments, controller 660 may receive information from NMR sensor 604 about drilling conditions in wellbore 618 and controller 660 may provide a command to BHA 674 to modify certain drilling parameters. For example, controller 660 may provide a command to adjust or change the drilling direction of drill tool 614 based on a message contained in information provided by NMR sensor 604. In that regard, the information provided by NMR sensor 604 to controller 660 may include certain drilling conditions such as physical or chemical properties of the drilling mud in the subterranean environment. Accordingly, controller 660 may use processor 661 to determine a characteristic of the sample in a medium surrounding drill tool 662 using the data collected from NMR sensor 604. Wireline tool 602A and LWD tool 602B may be referred to collectively hereinafter as a downhole tool 602.

Figure 7:
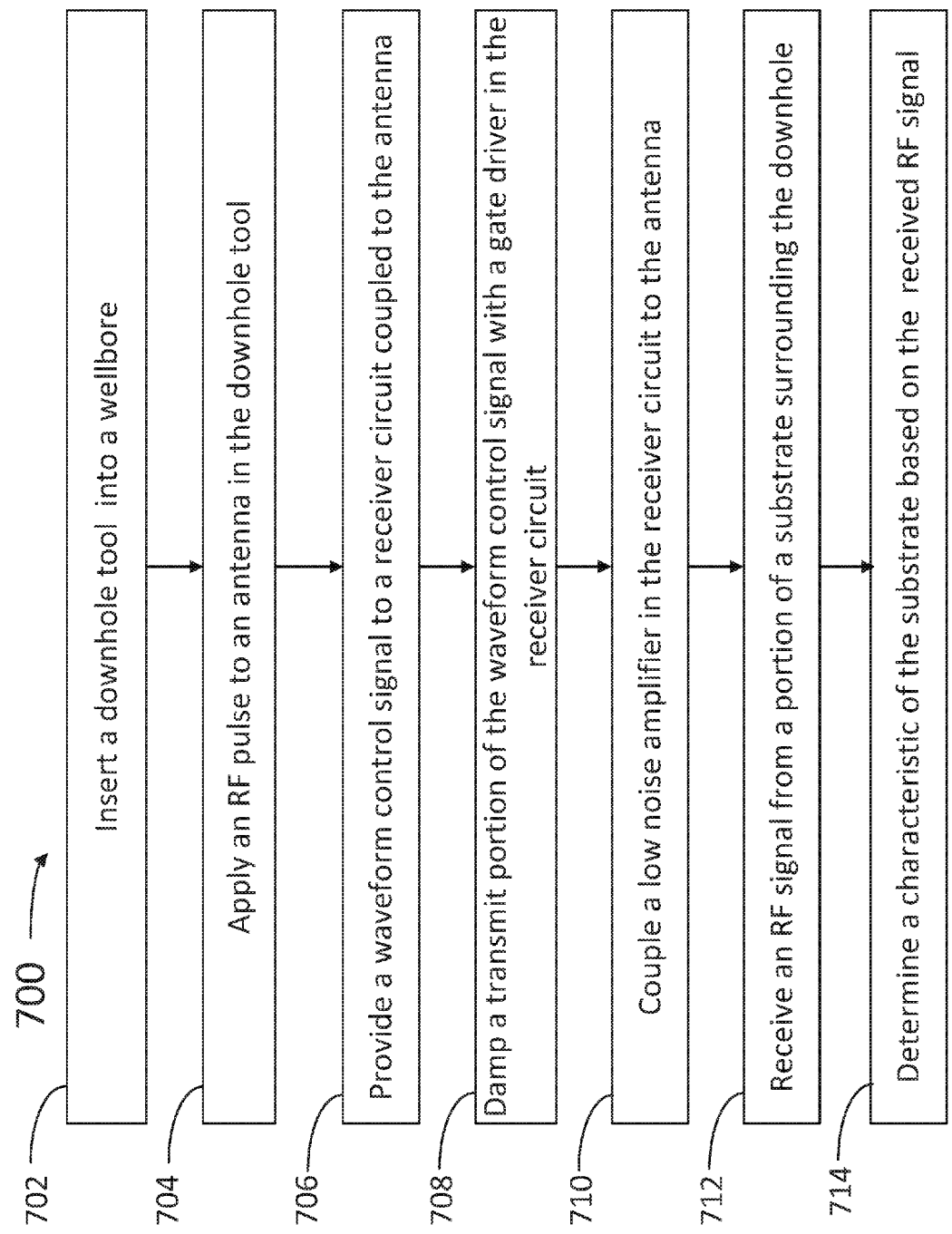
FIG. 7 illustrates a flow chart including steps in a method for damping an antenna in an NMR sensor for use in a wireline or LWD logging tool.

FIG. 7 illustrates a flow chart including steps in a method 700 for damping an antenna in an NMR sensor for use in a downhole tool (e.g., NMR sensor 110 and 604, wireline tool 602A, and LWD tool 602B, cf. FIGS. 1 and 6A, B). Steps in method 700 may be performed completely or partially by a controller having a processor executing commands stored in a memory, wherein the controller may be located in a logging facility (e.g., controllers 160, 660 processors 161, 661, and memories 162, 662 and electronic equipment 610 in logging facility 628, cf. FIGS. 1 and 6A, B). An NMR sensor consistent with the steps in method 700 may include an antenna, a receiver circuit, and an LNA circuit consistent with the present disclosure (e.g., antenna 135, receiver front end 101, including LNA 131, cf. FIGS. 1, 3, and 5). The LNA circuit may be coupled to the antenna via a critical resistor and a dump transistor, the dump transistor driven by a gate drive in the receiver circuit (e.g., critical resistor 340, dump transistor 330, and gate drive 100, cf. FIGS. 3 and 5).

Methods consistent with the scope of the present disclosure may include at least one, but not all, of the steps illustrated in method 700, performed in a different sequence, or even partially overlapping in time or being simultaneous with one another.

Step 702 includes introducing a downhole tool into a wellbore. In some embodiments, step 702 may also include applying a static magnetic field overlapping at least a portion of a substrate (e.g., a subterranean formation) surrounding the wellbore. Step 704 includes applying a radio-frequency (RF) pulse to the antenna in the downhole tool. The RF pulse may be an RF excitation pulse applied to the substrate surrounding the downhole tool in the wellbore for an NMR measurement. In some embodiments, step 704 includes selecting a frequency bandwidth for the RF excitation pulse according to a portion of the substrate surrounding the wellbore that is desired to be measured. Furthermore, in some embodiments step 704 may include selecting a center frequency of the bandwidth of the RF excitation pulse at a specified static magnetic field intensity in a selected portion of the substrate surrounding the wellbore. In yet other embodiments, step 704 includes selecting the center frequency of the bandwidth of the RF excitation pulse according to an NMR resonance frequency of a target substance expected in the substrate surrounding the wellbore.

In some embodiments, step 704 may include providing a focusing pulse to prompt an echo signal from the portion of the substrate. In such embodiments, the focusing pulse may be similar in bandwidth to the RF excitation signal, but having a different time duration. For example, in some embodiments the time duration of the focusing pulse may be about twice as long as the time duration of the excitation pulse. Furthermore, the time spacing between the pulse signal and the focusing signal may be adjusted appropriately in order to obtain an enhanced echo signal from the portion of the substrate.

Step 706 includes providing a waveform control signal to the receiver circuit coupled to the antenna. In some embodiments, providing a waveform control signal may include providing a square pulse using a digital board, where the square pulse has a width approximately equal to the duration of the RF excitation pulse. In some embodiments, step 706 may include providing a waveform having a plurality of cycles, each cycle including the square pulse and each cycle having a total time duration given by a period of time, as described in detail above (e.g., Te 201 cf. FIG. 2).

Step 708 includes damping an excess voltage in the antenna at the end of a transmit period of the waveform control signal. In some embodiments, step 708 includes using a gate driver in the receiver circuit to provide a nonlinear gate signal to the dump transistor. The nonlinear gate signal may include a first stage having a first voltage damping rate and a second stage having a second voltage damping rate. In some embodiments, step 708 may include performing the first stage and the second stage. For example, the first stage may include damping the antenna voltage at a fast rate using the source-drain channel in the linear portion of the current-voltage (IV) operation curve of the dump transistor. Likewise, the second stage may include damping the antenna voltage at a slower rate. Accordingly, step 708 may include performing the second stage by coupling the source-drain channel in the dump transistor with an RC circuit having a slow response time relative to the first stage in the cutoff region of the transistor.

Step 710 includes coupling the low noise amplifier in the receiver circuit to the antenna. In some embodiments, step 710 includes opening a switch in the gate drive to decouple the critical resistor from the input of the low noise amplifier. Further, in some embodiments step 710 includes turning a dump transistor 'off' with the gate drive by biasing the gate voltage of the dump transistor below the Vgs threshold.

Step 712 includes receiving an RF signal from a portion of a substrate surrounding the wellbore. In some embodiments, step 712 may include amplifying the RF signal in the LNA, and providing the amplified signal to the processor in the controller. In some embodiments, step 712 may include receiving a plurality of RF signals from the portion of the substrate, and averaging the plurality of signals to obtain a statistically significant value of a signal property. In some embodiments, a signal property is a relaxation time of the received RF signal, and a statistically significant value may include averaging a plurality of measurements of the relaxation time over a plurality of RF excitation pulse repetitions.

Step 714 includes determining a characteristic of the substrate based on the received RF signal. In some embodiments, step 714 may include measuring a viscosity of a substance in the substrate using the characteristic of the substrate. In some embodiments, step 714 may include measuring a hydrocarbon content in the substrate.

Those skilled in the art will readily appreciate that the methods described herein, or large portions thereof, may be automated at some point such that a computerized system may be programmed to design, predict, and fabricate ultra-fast damping systems for NMR sensors. Computer hardware used to implement the various methods and algorithms described herein can include a processor configured to execute one or more sequences of instructions, programming stances, or code stored on a non-transitory, computer-readable medium. The processor can be, for example, a general purpose microprocessor, a microcontroller, a digital signal processor, an application specific integrated circuit, a field programmable gate array, a programmable logic device, a controller, a state machine, a gated logic, discrete hardware components, an artificial neural network, or any like suitable entity that can perform calculations or other manipulations of data. In some embodiments, computer hardware can further include elements such as, for example, a memory (e.g., random access memory (RAM), flash memory, read only memory (ROM), programmable read only memory (PROM), electrically erasable programmable read only memory (EEPROM)), registers, hard disks, removable disks, CD-ROMS, DVDs, or any other like suitable storage device or medium.

Executable sequences described herein can be implemented with one or more sequences of code contained in a memory. In some embodiments, such code can be read into the memory from another machine-readable medium. Execution of the sequences of instructions contained in the memory can cause a processor to perform the process steps described herein. One or more processors in a multi-processing arrangement can also be employed to execute instruction sequences in the memory. In addition, hard-wired circuitry can be used in place of or in combination with software instructions to implement various embodiments described herein. Thus, the present embodiments are not limited to any specific combination of hardware and/or software.

As used herein, a machine-readable medium will refer to any medium that directly or indirectly provides instructions to a processor for execution. A machine-readable medium can take on many forms including, for example, non-volatile media, volatile media, and transmission media. Non-volatile media can include, for example, optical and magnetic disks. Volatile media can include, for example, dynamic memory. Transmission media can include, for example, coaxial cables, wire, fiber optics, and wires that form a bus. Common forms of machine-readable media can include, for example, floppy disks, flexible disks, hard disks, magnetic tapes, other like magnetic media, CD-ROMs, DVDs, other like optical media, punch cards, paper tapes and like physical media with patterned holes, RAM, ROM, PROM, EPROM and flash EPROM.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The disclosure illustratively disclosed herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces. If there is any conflict in the usages of a word or term in this specification and one or more patent or other documents that may be incorporated herein by reference, the definitions that are consistent with this specification should be adopted.

Embodiments disclosed herein include:

A. A circuit, including a low noise amplifier (LNA) that receives a radio-frequency (RF) signal from an antenna, an input transistor that receives a waveform control signal at a gate terminal, a control transistor that receives a gate signal from a source terminal in the input transistor when the waveform control signal is high and discharges the gate signal in to a current sink coupled to ground when the waveform control signal is low; and a buffer that couples a gate of the control transistor to a gate of a dump transistor, wherein the dump transistor couples the critical resistor to the input of the LNA when in 'on' state, and disconnects the critical resistor when the dump transistor is 'off'.

B. A system, including an antenna that transmits and receives radio-frequency (RF) signals, a power supply coupled with the antenna to provide a high voltage pulse to the antenna to transmit an RF excitation pulse, and an interface circuit coupling the antenna to a receiver circuit, wherein the receiver circuit switches a low noise amplifier (LNA) 'off' when the antenna transmits the RF excitation pulse and 'on' when the antenna receives an RF echo signal, the receiver circuit further including an input transistor that receives a waveform control signal at the gate terminal, a control transistor that receives a gate signal from a source terminal in the input transistor when the waveform control signal is high and discharges the gate signal in to a current sink to ground when the waveform control signal is low, and a buffer circuit coupling the control transistor to a dump transistor, wherein the dump transistor couples a critical resistor with the input of the LNA or decouples the critical resistor from the input of the LNA.

C. A method, including inserting a wireline logging tool into a wellbore, applying a radio-frequency (RF) pulse to an antenna in the wireline logging tool, providing a waveform control signal to a receiver circuit coupled to the antenna, damping a transmit portion of the waveform control signal with a gate driver in the receiver circuit, and coupling a low noise amplifier in the receiver circuit to the antenna.

Each of embodiments A, B, and C may have one or more of the following additional elements in any combination:

Element 1: a plurality of resistor-capacitor (RC) components selected according to a damp period and a receive period. Element 2: wherein the control transistor and the dump transistor are selected from the same batch in a fabrication process. Element 3: wherein the buffer has a gate voltage in the dump transistor to follow a gate voltage in the control transistor. Element 4: wherein the dump transistor and the critical resistor damp an excess voltage in the antenna to the ground at a first rate when the excess voltage has a value between 10 volts and a 500 nano volts. Element 5: wherein the LNA is configured to dissipate an excess voltage in the antenna to ground when the excess voltage is between 500 nV and 10 nVs, at a second rate. Element 6: a resistor-capacitor (RC) circuit that biases the control transistor to determine the first rate, which lasts about 30 to 40 µs. Element 7: wherein the current source, the RC circuit and a gain of the control transistor determine the rate of discharge of the control FET's Gate signal. Element 8: a critical resistor to couple a drain of the dump transistor to the LNA, the critical resistor damping an excess voltage in the antenna to ground. Element 9: wherein the waveform control signal includes a pulse formed as a square signal corresponding to an RF excitation pulse transmitted by the antenna. Element 10: wherein the LNA is configured to receive the RF signal within about 40 µs of an end of the RF excitation pulse transmission by the antenna.

Element 11: a resistor-capacitor (RC) circuit coupled to the control transistor, the RC circuit having a resistor and a capacitor selected to reduce the gate signal at a reduced rate in conjunction with a gain value of the control transistor when the waveform control signal is low. Element 12: wherein a controlled discharge results in low charge injection when one of the input transistor, the control transistor, or the dump transistor transitions from active to cutoff region. Element 13: wherein the dump transistor and critical resistor damps an excess voltage in the antenna after transmitting the RF excitation pulse to ground at a first rate when the excess voltage has a value between 10 volts and 500 nVs. Element 14: wherein the LNA dissipates an excess voltage in the antenna to ground when the excess voltage is between 500 nVs and 10 nVs, at a second rate. Element 15: wherein the first rate of decay of excess energy in the antenna is determined by a total impedance posed by the critical resistor and the impedance of the dump transistor.

Element 16: applying a static magnetic field overlapping at least a portion of a substrate surrounding the wellbore, receiving an RF signal from a portion of a substrate surrounding the wellbore, and determining a characteristic of the substrate based on the RF signal received from the portion of the substrate surrounding the wellbore. Element 17: wherein the RF pulse is an NMR excitation pulse, and applying the RF pulse to the antenna includes transmitting, with the antenna, the NMR excitation pulse to a portion of a substrate surrounding the wellbore. Element 18: providing a focusing pulse to prompt an echo signal from a portion of the substrate, wherein receiving the RF signal includes receiving the echo signal. Element 19: wherein damping the waveform control signal after a transmit period includes dumping an excess voltage in the antenna at a first rate, and wherein the first rate is determined by a linear portion of a current-to-voltage curve for the transistor. Element 20: wherein damping the waveform control signal further includes damping the excess voltage in the antenna to the ground at a second rate lower than the first rate. Element 21: shifting a rate of damping the excess voltage in the antenna from the first rate to the second rate when a gate terminal voltage in the control transistor is approximately equal to a gate-source threshold voltage of the control transistor.

What is claimed is:

1. A circuit, comprising:
   a low noise amplifier (LNA) that receives a radio-frequency (RF) signal from an antenna;
   an input transistor that receives a waveform control signal at a gate terminal;
   a control transistor that receives a gate signal from a source terminal in the input transistor when the waveform control signal is high and discharges the gate signal in to a current sink coupled to ground when the waveform control signal is low; and
   a buffer that couples a gate of the control transistor to a gate of a dump transistor, wherein the dump transistor couples the critical resistor to the input of the LNA when in 'on' state, and disconnects the critical resistor when the dump transistor is 'off'.

2. The circuit of claim 1, further comprising a plurality of resistor-capacitor (RC) components selected according to a damp period and a receive period.

3. The circuit of claim 1, wherein the control transistor and the dump transistor are selected from the same batch in a fabrication process.

4. The circuit of claim 1, wherein the buffer has a gate voltage in the dump transistor to follow a gate voltage in the control transistor.

5. The circuit of claim 1, wherein the dump transistor and the critical resistor damp an excess voltage in the antenna to the ground at a first rate when the excess voltage has a value between 10 volts and a 500 nano volts.

6. The circuit of claim 1, wherein the LNA is configured to dissipate an excess voltage in the antenna to ground when the excess voltage is between 500 nV and 10 nVs, at a second rate.

7. The circuit of claim 6, further including a resistor-capacitor (RC) circuit that biases the control transistor to determine the first rate, which lasts about 30 to 40 µs.

8. The circuit of claim 7, wherein the current source, the RC circuit and a gain of the control transistor determine the rate of discharge of the control FET's Gate signal.

9. The circuit of claim 1, further comprising a critical resistor to couple a drain of the dump transistor to the LNA, the critical resistor damping an excess voltage in the antenna to ground.

10. The circuit of claim 1, wherein the waveform control signal includes a pulse formed as a square signal corresponding to an RF excitation pulse transmitted by the antenna.

11. The circuit of claim 1, wherein the LNA is configured to receive the RF signal within about 40 µs of an end of the RF excitation pulse transmission by the antenna.

12. A system, comprising:
    an antenna that transmits and receives radio-frequency (RF) signals;

a power supply coupled with the antenna to provide a high voltage pulse to the antenna to transmit an RF excitation pulse; and an interface circuit coupling the antenna to a receiver circuit, wherein the receiver circuit switches a low noise amplifier (LNA) 'off' when the antenna transmits the RF excitation pulse and 'on' when the antenna receives an RF echo signal, the receiver circuit further including:

an input transistor that receives a waveform control signal at the gate terminal;

a control transistor that receives a gate signal from a source terminal in the input transistor when the waveform control signal is high and discharges the gate signal in to a current sink to ground when the waveform control signal is low; and a buffer circuit coupling the control transistor to a dump transistor, wherein the dump transistor couples a critical resistor with the input of the LNA or decouples the critical resistor from the input of the LNA.

13. The system of claim 12, further comprising a resistor-capacitor (RC) circuit coupled to the control transistor, the RC circuit having a resistor and a capacitor selected to reduce the gate signal at a reduced rate in conjunction with a gain value of the control transistor when the waveform control signal is low.

14. The system of claim 12, wherein a controlled discharge results in low charge injection when one of the input transistor, the control transistor, or the dump transistor transitions from active to cutoff region.

15. The system of claim 12, wherein the dump transistor and critical resistor damps an excess voltage in the antenna after transmitting the RF excitation pulse to ground at a first rate when the excess voltage has a value between 10 volts and 500 nVs.

16. The system of claim 12, wherein the LNA dissipates an excess voltage in the antenna to ground when the excess voltage is between 500 nVs and 10 nVs, at a second rate.

17. The system of claim 13, wherein the first rate of decay of excess energy in the antenna is determined by a total impedance posed by the critical resistor and the impedance of the dump transistor.

18. A method, comprising:
inserting a downhole tool into a wellbore;
applying a radio-frequency (RF) pulse to an antenna in the downhole tool;
providing a waveform control signal to a receiver circuit coupled to the antenna;
damping a transmit portion of the waveform control signal with a gate driver in the receiver circuit; and
coupling a low noise amplifier in the receiver circuit to the antenna.

19. The method of claim 18, further including:
applying a static magnetic field overlapping at least a portion of a substrate surrounding the wellbore;
receiving an RF signal from a portion of a substrate surrounding the wellbore; and
determining a characteristic of the substrate based on the RF signal received from the portion of the substrate surrounding the wellbore.

20. The method of claim 18, wherein the RF pulse is an NMR excitation pulse, and applying the RF pulse to the antenna comprises transmitting, with the antenna, the NMR excitation pulse to a portion of a substrate surrounding the wellbore.

21. The method of claim 18, further including providing a focusing pulse to prompt an echo signal from a portion of the substrate, wherein receiving the RF signal comprises receiving the echo signal.

22. The method of claim 18, wherein damping the waveform control signal after a transmit period includes dumping an excess voltage in the antenna at a first rate, and wherein the first rate is determined by a linear portion of a current-to-voltage curve for the transistor.

23. The method of claim 22, wherein damping the waveform control signal further includes damping the excess voltage in the antenna to the ground at a second rate lower than the first rate.

24. The method of claim 23, further including shifting a rate of damping the excess voltage in the antenna from the first rate to the second rate when a gate terminal voltage in the control transistor is approximately equal to a gate-source threshold voltage of the control transistor.

25. The method of claim 18, wherein inserting the downhole tool into the wellbore includes one of inserting a wireline logging tool into a formed wellbore or a LWD tool into a wellbore that is being drilled.

* * * * *